United States Patent
Jeon et al.

(10) Patent No.: US 11,076,499 B2
(45) Date of Patent: Jul. 27, 2021

(54) FOLDABLE DISPLAY DEVICE

(71) Applicant: LG Display Co., Ltd., Seoul (KR)

(72) Inventors: Seung-O Jeon, Seoul (KR);
Young-Joon Yun, Paju-si (KR);
Shin-Suk Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/654,741

(22) Filed: Oct. 16, 2019

(65) Prior Publication Data
US 2020/0178410 A1 Jun. 4, 2020

(30) Foreign Application Priority Data
Nov. 30, 2018 (KR) ........................ 10-2018-0151948

(51) Int. Cl.
*H05K 5/02* (2006.01)
*E05D 7/00* (2006.01)
*H05K 5/00* (2006.01)

(52) U.S. Cl.
CPC ............. *H05K 5/0226* (2013.01); *E05D 7/00* (2013.01); *H05K 5/0017* (2013.01); *E05Y 2900/606* (2013.01)

(58) Field of Classification Search
CPC .... G06F 1/1681; G06F 1/1652; G06F 1/1618; E05Y 2900/606; E05D 3/06; E05D 3/186; E05D 7/00; H04M 1/0216; H04M 1/022; H04M 1/0268; H05K 5/0017; H05K 5/0226
See application file for complete search history.

(56) References Cited

U.S. PATENT DOCUMENTS

| | | | |
|---|---|---|---|
| 9,761,182 B2 | 9/2017 | Lee et al. | |
| 10,067,536 B1 * | 9/2018 | Watamura | G06F 1/1616 |
| 10,234,905 B2 * | 3/2019 | Chen | H04M 1/0216 |
| 10,631,608 B2 | 4/2020 | Lin et al. | |
| 2014/0111954 A1 | 4/2014 | Lee et al. | |
| 2015/0255023 A1 | 9/2015 | Lee et al. | |

(Continued)

FOREIGN PATENT DOCUMENTS

CN 104200753 A 12/2014
CN 104900152 A 9/2015
(Continued)

OTHER PUBLICATIONS

European Patent Office, Extended European Search Report, EP Patent Application No. 19206845.0, dated Apr. 15, 2020, eight pages.
(Continued)

*Primary Examiner* — James Wu
(74) *Attorney, Agent, or Firm* — Fenwick & West LLP

(57) ABSTRACT

Disclosed is a display device including first and second set frames arranged adjacent to each other, a panel arranged on the first and second set frames, and a folding hinge unit arranged between the first set frame and the second set frame. The folding hinge unit includes a plurality of chain hinges arranged between the first and second set frames and configured to fold the first and second set frames inward and outward, and an X hinge including first and second connection chains coupled to the chain hinges and configured to control a folding trajectory of the chain hinges.

10 Claims, 5 Drawing Sheets

(56) References Cited

U.S. PATENT DOCUMENTS

| | | | |
|---|---|---|---|
| 2015/0373863 A1* | 12/2015 | Lin | G06F 1/1641 206/774 |
| 2017/0208699 A1* | 7/2017 | McDermid | G06F 1/1616 |
| 2017/0360170 A1 | 12/2017 | Lin et al. | |
| 2018/0196468 A1* | 7/2018 | Watamura | G06F 1/1652 |

FOREIGN PATENT DOCUMENTS

| | | | |
|---|---|---|---|
| CN | 105830140 A | 8/2016 |
| EP | 3 015 947 A1 | 5/2016 |
| WO | WO 2016/178659 A1 | 11/2016 |

OTHER PUBLICATIONS

China National Intellectual Property Administration, Office Action, CN Patent Application No. 201911148162.9, dated May 7, 2021, 16 pages.

* cited by examiner

FOLDABLE DISPLAY DEVICE

CROSS-REFERENCE TO RELATED APPLICATIONS

This application claims the benefit of Republic of Korea Patent Application No. 10-2018-0151948, filed on Nov. 30, 2018, which is hereby incorporated by reference in its entirety.

BACKGROUND

Field of Technology

The present disclosure relates to a display device, and more particularly, to a foldable display device.

Discussion of the Related Art

Recently, in the information-oriented society, importance of display devices as a visual information transfer medium has been emphasized and, in order to occupy a main position in the future, display devices should satisfy requirements, such as low power consumption, thinness, light weight, high definition, etc.

Displays are divided into an emissive type display which autonomously emits light, such as a cathode ray tube (CRT), an electroluminescent (EL) element, a light emitting diode (LED), a vacuum fluorescent display (VFD), a field emission display (FED), a plasma display panel (PDP) and an organic light emitting diode (OLED), and a non-emissive type display which does not autonomously emit light, such as a liquid crystal display (LCD).

As technology has advanced, a flexible display device, which is manufactured using a flexible material, such as plastic, instead of an inflexible glass substrate applied to conventional displays, and thus maintains display performance thereof even if bent like paper, rapidly rises as a next generation display device.

Flexible display devices may be divided into an unbreakable type display which has high durability using a plastic thin film transistor substrate rather than glass, a bendable type display which is bendable without cracking, a rollable type display which can be rolled up, a foldable type display, etc. These flexible display devices may have advantageous, such as space utilization and advantages in interior design, and be applied to various fields.

Particularly, in order to implement a large scale together with ultra-thinness, light weight and miniaturization, research on a foldable display device which is portable in a folded state and displays an image in an unfolded state is being vigorously carried out.

The foldable display device may be applied to various fields, such as not only mobile devices including a mobile phone, an ultra-mobile PC, an e-book and e-paper, but also a TV, a monitor, etc.

The foldable display device includes a hinge mechanism which allows the foldable display device to be folded and unfolded.

Here, hinge mechanisms which are generally used are implemented as a multi-link hinge having various structures including a chain or a two-axis folding hinge including two hinge axes and interconnected by a central body.

Further, the above-described hinge mechanisms may be divided into an inner folding hinge which is folded under the condition that a display panel is located inside a display device, and an outer folding hinge which is folded under the condition that a display panel is located outside a display device, according to positions of display panels.

When a foldable display device is implemented using both an inner folding hinge and an outer folding hinge, it is difficult to simultaneously control both curvature and trajectory of a folding section and thus it is difficult to commercialize inner/outer folding hinge mechanisms.

SUMMARY

Accordingly, the present disclosure is directed to a display device that substantially obviates one or more problems due to limitations and disadvantages of the related art.

An aspect of the present disclosure is to provide a display device which has a folding hinge unit being usable as both inner and outer folding hinges and may control the trajectory of a folding section.

Additional advantages, effects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these effects and other advantages and in accordance with the purpose of the invention, as embodied and broadly described herein, a display device includes first and second set frames arranged adjacent to each other, a panel arranged on the first and second set frames, and a folding hinge unit arranged between the first set frame and the second set frame, wherein the folding hinge unit includes a plurality of chain hinges arranged between the first and second set frames and configured to fold the first and second set frames inward and outward, and an X hinge including first and second connection chains coupled to the chain hinges and configured to control a folding trajectory of the chain hinges.

Central regions of the chain hinges may be connected so that the chain hinges are rotatable with respect to each other.

The chain hinges may have a shape having a width that gradually decreases from a convex central region thereof to tapered upper and lower regions thereof.

The first connection chain and the second connection chain may have the same length.

The first connection chain may include a first fixing pin fixed to one chain hinge located at a position close to the first set frame, a second fixing pin fixed to another chain hinge located at a position close to the second set frame, and a first connector connected to the first fixing pin and the second fixing pin.

The second connection chain may include a third fixing pin fixed to one chain hinge located at a position close to the first set frame, a fourth fixing pin fixed to another chain hinge located at a position close to the second set frame, and a second connector connected to the third fixing pin and the fourth fixing pin.

The position of the first fixing pin may be closer to the first set frame than the position of the third fixing pin, and the position of the fourth fixing pin may be closer to the second set frame than the position of the second fixing pin.

The first to fourth fixing pins may be coupled to the upper regions of the corresponding chain hinges.

A slide section having a length changed by a sliding plate and a spring configured to control sliding may be formed in at least one of the first set frame or the second set frame.

The chain hinges and the X hinge may be formed of metal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION

Figure 1:
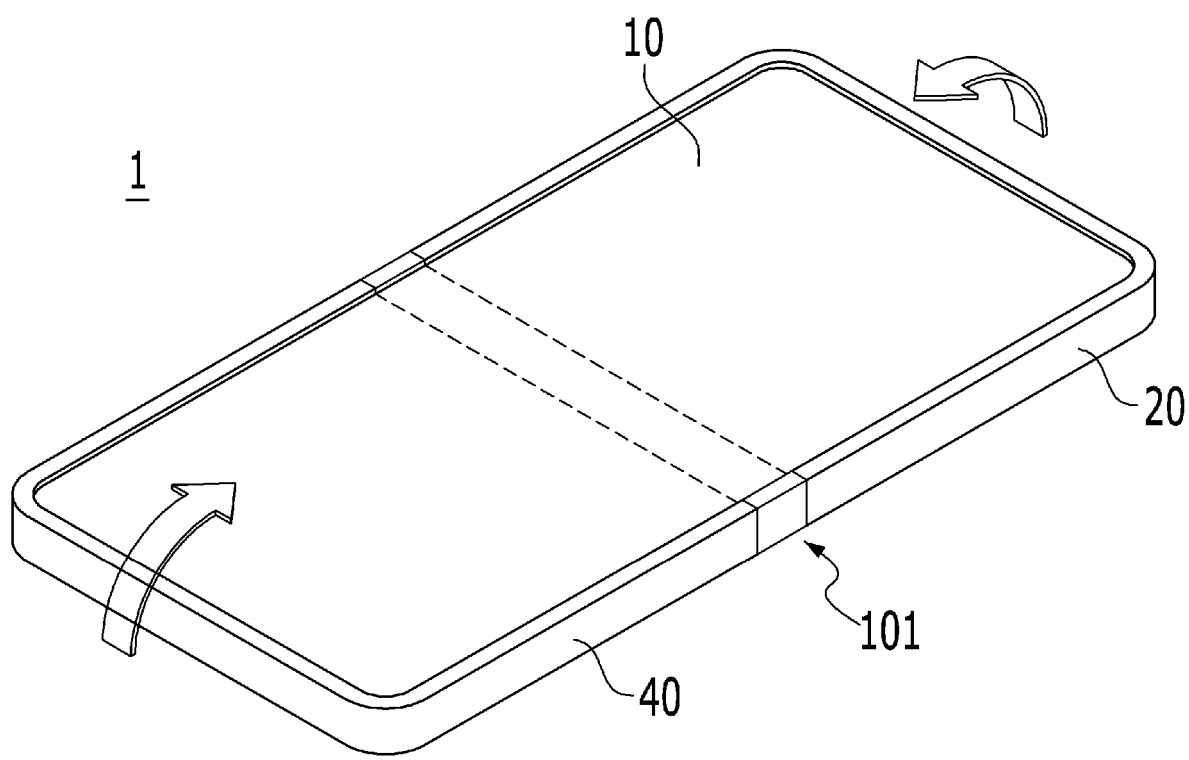
FIG. 1 is a perspective view of a display device in accordance with one embodiment of the present disclosure.

Reference will now be made in detail to the preferred embodiments of the present invention, examples of which are illustrated in the accompanying drawings. In the following description of the embodiments, it will be understood that, when a part, such as a layer (film), a region, a pattern or a structure, is said to be "on" or "under" another part, such as a substrate, another layer (film), a region, a pad or a pattern, the part may be located "directly on" or "directly under" the other part or other parts may be interposed between both parts. In addition, it will be understood that a criteria for the upward direction or the outward direction of each layer is described based on the drawings.

Shapes, sizes, rates, angles, numbers, etc. disclosed in the drawings are exaggerated, omitted or schematically illustrated for convenience and clarity of description. Further, sizes of respective elements do not entirely reflect actual sizes of the elements. In the following description of the embodiments, the same elements are denoted by the same reference numerals even though they are depicted in different drawings. Hereinafter, the embodiments of the present invention will be described with reference to the accompanying drawings.

Figure 3:
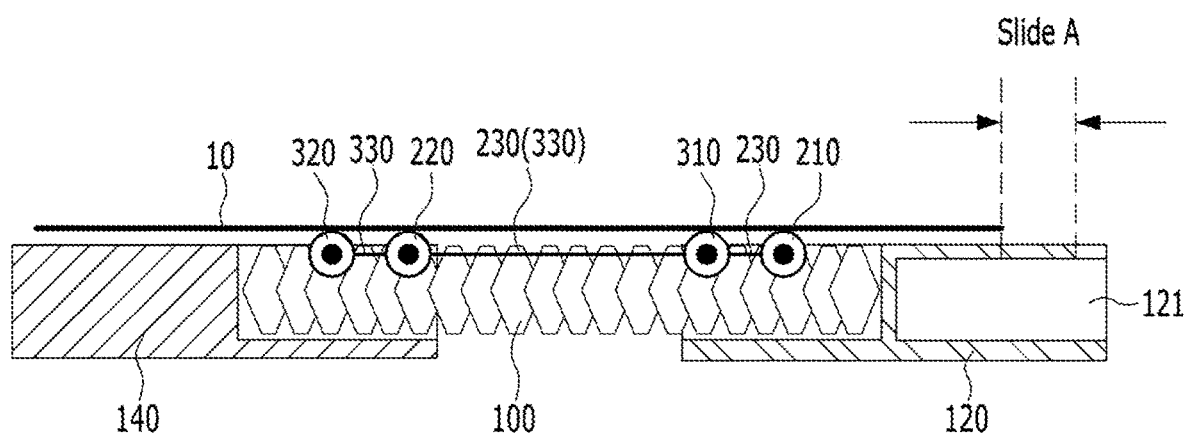
FIG. 3 is a cross-sectional view illustrating an unfolding operation of the folding hinge unit of FIG. 1 in accordance with one embodiment of the present disclosure.
Figure 4:
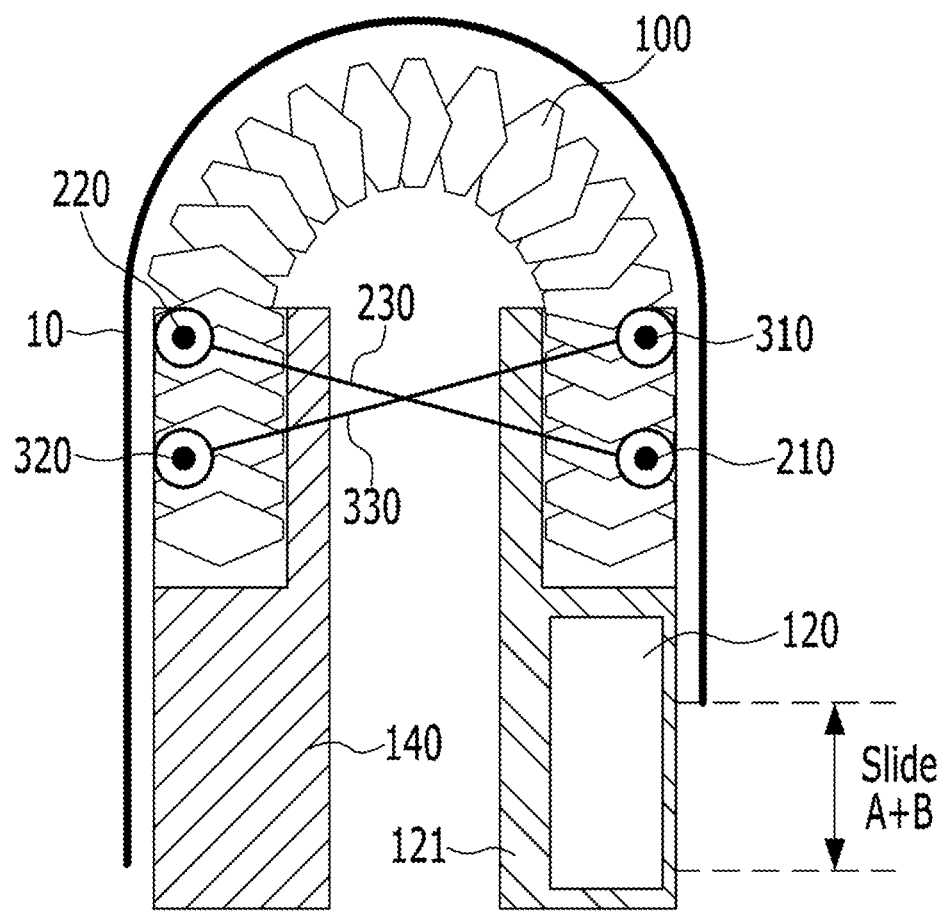
FIG. 4 is a cross-sectional view illustrating an outer folding operation of the folding hinge unit of FIG. 1 in accordance with one embodiment of the present disclosure.
Figure 5A:
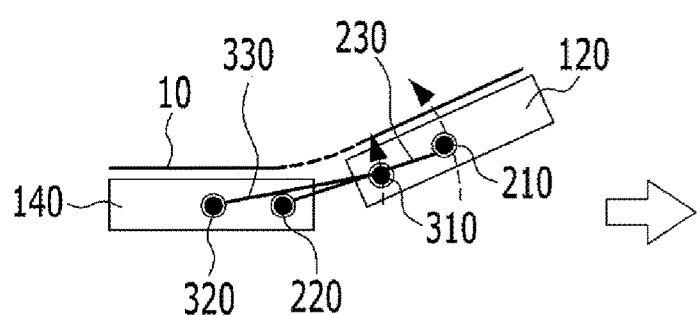
FIGS. 5A to 5D are views illustrating trajectory control by the folding hinge unit of FIG. 1 in accordance with one embodiment of the present disclosure.
Figure 5B:
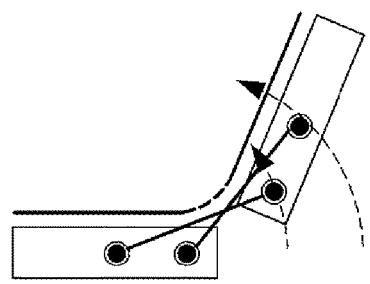
Figure 5C:
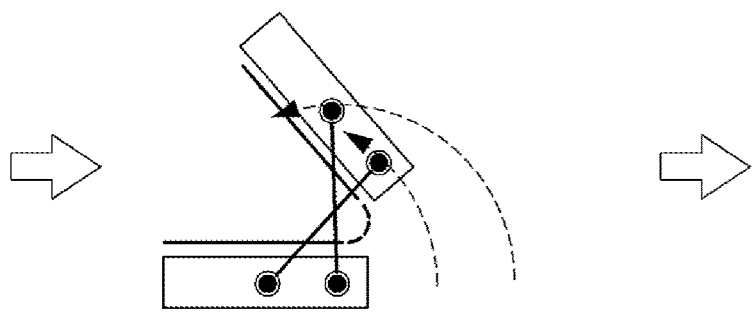
Figure 5D:
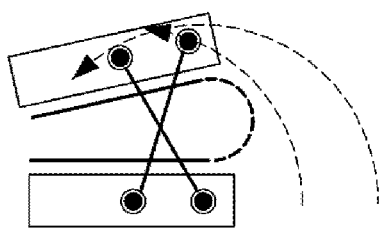

FIG. 1 is a perspective view of a display device in accordance with one embodiment of the present invention, FIG. is a cross-sectional view illustrating an inner folding operation of a folding hinge unit of FIG. 1, FIG. 3 is a cross-sectional view illustrating an unfolding operation of the folding hinge unit of FIG. 1, FIG. 4 is a cross-sectional view illustrating an outer folding operation of the folding hinge unit of FIG. 1, and FIGS. 5A to 5D are views illustrating trajectory control by the folding hinge unit of FIG. 1.

Referring to FIGS. 1 to 5, a display device 1 in accordance with one embodiment of the present disclosure includes a first frame 20, a second frame 40, a first set frame 120, a second set frame 140 and a folding hinge unit 101.

The first frame 20 and the second frame 40 may be arranged adjacent to each other and receive a panel 10 so that inner folding and outer folding operations of the panel 10 are enabled by the folding hinge unit 101.

Figure 2:
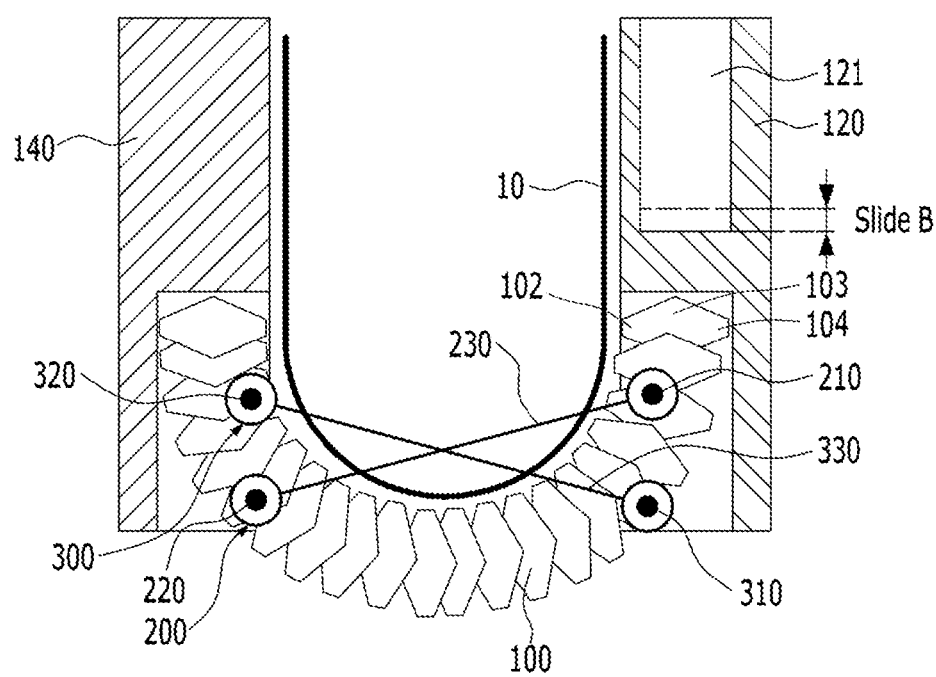
FIG. 2 is a cross-sectional view illustrating an inner folding operation of a folding hinge unit of FIG. 1 in accordance with one embodiment of the present disclosure.

The first set frame 120 and the second set frame 140 may be arranged adjacent to each other and support the lower portion of the panel 10, as exemplarily shown in FIGS. 2 to 4. For example, the first set frame 120 may be located inside the first frame 20, and the second set frame 140 may be located inside the second frame 40.

The panel 10 includes a display area in which an image is displayed by a pixel array including a plurality of pixels. The display area may include a first display area in which the first set frame 120 is located, a second display area in which the second set frame 140 is located, and a bending area.

The first set frame 120 may be arranged adjacent to the second set frame 140 with the bending area disposed therebetween. The bending area may be defined as an area located between the first display area and the second display area of the panel 10. The bending area may be spread into a flat surface state or be bent into a curved surface state to have a constant radius of curvature according to folding.

The first frame 20 may support or receive various parts corresponding to the first display area of the panel 10, for example, the first set frame 120, and the second frame 40 may support or receive various parts corresponding to the second display area of the panel 10, for example, the second set frame 140.

In one embodiment, the first display area and the second display area may have the same size, without being limited thereto. Otherwise, one of the first display area or the second display area may have a greater size than the other display area. In this case, in the folded state of the panel 10, a part of a display area having a relatively greater size is exposed to the outside, and the exposed part of the display area may continuously display date, time, a remaining battery quantity, notifications, etc., even when the display device 1 is switched off.

Here, the panel 10 may be a flexible organic light emitting display panel, a flexible electrophoretic display panel, a flexible electrowetting display panel or a flexible quantum dot display panel.

The panel 10 is located on the first set frame 120 and the second set frame 140, and may be located inside (on the inner surfaces of) or outside (on the outer surfaces of) the first set frame 120 and the second set frame 140 when the panel is folded. Of course, as needed, another panel 10 may be located under the first set frame 120 and the second set frame 140. As such, the panel 10 may be located on both inner and outer surfaces of the first set frame 120 and the second set frame 140 in the folded state, or the panel 10 may be located on one of the inner and outer surfaces of the first set frame 120 and the second set frame 140.

Here, folding may be defined as including a folding operation or an unfolding operation of the bending area, and be implemented through the folding hinge unit 101.

The folding hinge unit 101 may be arranged between the first set frame 120 and the second set frame 140.

The folding hinge unit 101 has a structure in which a plurality of chain hinges 100 are continuously connected to form an assembly and an X hinge is coupled to some sections of the assembly of the chain hinges 100 so as to be foldable and unfoldable, and may implement both an inner folding operation and an outer folding operation.

Here, the assembly formed by continuously connecting the chain hinges 100 may be referred to as a chain hinge assembly, a chain hinge continuum or the like.

The chain hinges 100 may be arranged between the first set frame 120 and the second set frame 140.

Here, the chain hinges 100 are continuously connected so as to be rotatable, and may thus fold the first set frame 120 and the second set frame 140 in the inward direction and the outward direction.

The chain hinges 100 may have a shape, the width of which gradually decreases from a convex central region thereof to tapered upper and lower regions thereof. For example, each chain hinge 100 may have a first region 102 forming the upper region thereof, a second region 103 forming the central region thereof and a third region 104 forming the lower region thereof, and the first region 102 and the third region 104 may have symmetrical shapes (for example, the chain hinge 100 having a diamond shape or a symmetrical trapezoidal shape).

Here, the central regions, i.e., the second regions 103, of the chain hinges 100, may be connected so that the chain hinges 100 are rotatable with respect to each other. For example, pins, hinges or the like may be coupled to the central regions of the chain hinges 100. Therefore, the chain hinges 100 may be rotated, and thus positions of the chain hinges 100 may be changed while having a constant radius of rotation.

The above-described chain hinge assembly has a continuous connection structure having small mechanical height differences, and may thus have a constant radius of rotation even if it is folded inward or outward, thereby providing smooth inner/outer folding requirements of the folding hinge unit 101. Further, the chain hinge assembly does not require installation of an outer edge unit necessary to control curvature when a configuration in which a radius of curvature is varied according to inner/outer folding operations is applied as in conventional chain hinges, and may thus have a simple configuration.

The X hinge may include a first connection chain 200 and a second connection chain 300 coupled to the chain hinges 100, and control a folding trajectory of the above-described chain hinges 100 (more particularly, the chain hinge assembly).

Here, the first connection chain 200 and the second connection chain 300 may have the same length. Of course, according to embodiments, the first connection chain 200 and the second connection chain 300 may have different lengths.

The first connection chain 200 may include a first fixing pin 210, a second fixing pin 220 and a first connector 230, and the second connection chain 300 may include a third fixing pin 310, a fourth fixing pin 320 and a second connector 330.

In the first connection chain 200, the first fixing pin 210 may be fixed to one chain hinge 100 located at a position adjacent to the first set frame 120, and the second fixing pin 220 may be fixed to another chain hinge 100 located at a position adjacent to the second set frame 140. The first connector 230 may be connected to the first fixing pin 210 and the second fixing pin 220.

In the second connection chain 300, the third fixing pin 310 may be fixed to one chain hinge 100 located at a position adjacent to the first set frame 120, and the fourth fixing pin 320 may be fixed to another chain hinge 100 located at a position adjacent to the second set frame 140. The second connector 330 may be connected to the third fixing pin 310 and the fourth fixing pin 320.

In terms of the respective positions of the first to fourth fixing pins 210, 220, 310 and 320 at the chain hinges 100, the position of the first fixing pin 210 may be closer to the first set frame 120 than the position of the third fixing pin 310, and the position of the fourth fixing pin 320 may be closer to the second set frame 140 than the position of the second fixing pin 220.

Therefore, the first connector 230 and the second connector 330 may intersect in an X shape in an inner folded state shown in FIG. 2 and an outer folded state shown in FIG. 4, and be located parallel to each other or to overlap each other in an unfolded state shown in FIG. 3.

Here, the first to fourth fixing pins 210, 220, 310 and 320 of the first connection chain 200 and the second connection chain 300 may be coupled to any one of the upper, central and lower regions of the respective chain hinges 100, as needed. Although FIG. 2 illustrates various positions of the first to fourth fixing pins 210, 220, 310 and 320 coupled to the chain hinges 100, the first to fourth fixing pins 210, 220, 310 and 320 of the first connection chain 200 and the second connection chain 300 may be respectively coupled to the upper regions, i.e., the first regions 102, of the respective chain hinges 100, as exemplarily shown in FIGS. 3 and 4.

The above-described chain hinges 100 and X hinge may be formed of plastic, metal or the like.

A slide section 121 having a length, which is changed by a sliding plate (not shown) and a spring (not shown) to control sliding, may be formed in at least one of the first set frame 120 or the second set frame 140, to which the above-described folding unit 101 is coupled. In a foldable display device, a sliding structure implemented by the sliding plate and the spring is known by technologies filed in advance and a detailed description thereof will thus be omitted.

As the display device having the folding hinge unit 101 including the above-described elements in accordance with this embodiment is folded in the inner folded state in which the panel 10 is located inside the first set frame 120 and the second set frame 140, as exemplarily shown in FIG. 2, the chain hinges 100 may bend the panel 10 through operation of the X hinge while having constant curvature and trajectory in order shown in FIGS. 5A to 5D. Here, the slide section 121 of the first set frame 120 is changed to a section B having the minimum length.

Further, when the display device becomes in the unfolded state so that the panel 10 is unfolded, as exemplarily shown in FIG. 3, the chain hinges 100 may be disposed in parallel through operation of the X hinge while having constant curvature and trajectory, and maintain the horizontal state of the panel 10. Here, the slide section 121 in the first set frame 120 is changed to a section A having an increased length.

Further, as the display device is folded in the outer folded state in which the panel 10 is located outside the first set frame 120 and the second set frame 140, as exemplarily shown in FIG. 4, the chain hinges 100 may bend the panel 10 through operation of the X hinge while having constant curvature and trajectory. Here, the slide section 121 in the first set frame 120 is changed to a section A+B having a length corresponding to the sum of the length of the section B in the inner folded state and the length of the section A in the unfolded state.

The display device in accordance with this embodiment may control the curvature and trajectory of the folding section using the folding hinge unit 101 including the chain hinges 100 to control the curvature and the X hinge to control the trajectory, and may thus implement both the inner and outer folding operations.

The above-described display device in accordance with the present invention may be applied to various electronic equipment, such as a TV, a smartphone, a tablet PC, etc.

Further, although not shown in the drawings, the display device employing the folding hinge unit 101 in accordance with the embodiment may be applied to other types of folding structures including a sliding plate and a spring.

As apparent from the above description, a display device in accordance with the present invention controls the curvature and trajectory of a folding section using a folding hinge unit including chain hinges to control the curvature and an X hinge to control the trajectory, and may thus implement both inner and outer folding operations.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A foldable display device comprising:
   first and second set frames arranged adjacent to each other;
   a panel arranged on the first and second set frames; and
   a folding hinge unit arranged between the first set frame and the second set frame,
   wherein the folding hinge unit comprises:
   a plurality of chain hinges arranged between the first and second set frames and configured to fold the first and second set frames inward and outward; and
   an X hinge comprising first and second connection chains directly coupled to a same side of the chain hinges and configured to control a folding trajectory of the chain hinges,
   wherein the first connection chain and the second connection chain are not directly connected to each other.

2. The foldable display device according to claim 1, wherein central regions of the plurality of chain hinges are connected so that the plurality of chain hinges are rotatable with respect to each other.

3. The foldable display device according to claim 2, wherein each of the plurality of chain hinges has a shape having a width that gradually decreases from a convex central region thereof to tapered upper and lower regions thereof.

4. The foldable display device according to claim 3, wherein the first connection chain and the second connection chain have a same length.

5. The foldable display device according to claim 4, wherein the first connection chain comprises:
   a first fixing pin connected to a first chain hinge from the plurality of chain hinges at a fixed location in the first chain hinge, the first fixing pin located at a position closer to the first set frame than the second set frame;
   a second fixing pin connected to a second chain hinge from the plurality of chain hinges at a fixed location in the second chain hinge, the second fixing pin located at a position closer to the second set frame than the first set frame; and
   a first connector connected to the first fixing pin and the second fixing pin.

6. The foldable display device according to claim 5, wherein the second connection chain comprises:
   a third fixing pin connected to a third chain hinge from the plurality of chain hinges at a fixed location in the third chain hinge, the third fixing pin located at a position closer to the first set frame than the second set frame;
   a fourth fixing pin connected to a fourth chain hinge from the plurality of chain hinges at a fixed location in the fourth chain hinge, the fourth fixing pin located at a position closer to the second set frame than the first set frame; and
   a second connector connected to the third fixing pin and the fourth fixing pin.

7. The foldable display device according to claim 6, wherein the position of the first fixing pin is closer to the first set frame than the position of the third fixing pin, and the position of the fourth fixing pin is closer to the second set frame than the position of the second fixing pin.

8. The foldable display device according to claim 7, wherein the first to fourth fixing pins are coupled to upper regions of corresponding chain hinges.

9. The foldable display device according to claim 1, wherein the plurality of chain hinges and the X hinge are formed of metal.

10. The foldable display device of claim 1, wherein at least one of the first connection chain or the second connection chain overlaps more than two of the plurality of chain hinges while the foldable display device is in a folded state or the foldable display device is in an unfolded state.

* * * * *